(12) United States Patent
Ungerer et al.

(10) Patent No.: US 10,950,985 B2
(45) Date of Patent: Mar. 16, 2021

(54) SHIELD CONNECTION ELEMENT FOR A PRINTED CIRCUIT BOARD

(71) Applicant: Amphenol-Tuchel Electronics GmbH, Heilbronn (DE)

(72) Inventors: Christian Ungerer, Untergruppenbach-Unterheinriet (DE); Wolfgang Kerner, Erlenbach (DE); Manuel Obel, Oettingen (DE); Peter Oberhammer, Wallhausen (DE)

(73) Assignee: Amphenol-Tuchel Electronics GmbH, Heilbronn (DE)

( * ) Notice: Subject to any disclaimer, the term of this patent is extended or adjusted under 35 U.S.C. 154(b) by 0 days.

(21) Appl. No.: 16/082,140

(22) PCT Filed: Feb. 23, 2017

(86) PCT No.: PCT/EP2017/054247
§ 371 (c)(1),
(2) Date: Sep. 4, 2018

(87) PCT Pub. No.: WO2017/148803
PCT Pub. Date: Sep. 8, 2017

(65) Prior Publication Data
US 2019/0305490 A1    Oct. 3, 2019

(30) Foreign Application Priority Data
Mar. 2, 2016  (DE) .......................... 202016101128.0

(51) Int. Cl.
*H05K 1/02*   (2006.01)
*H05K 1/11*   (2006.01)
*H01R 13/6594*   (2011.01)
*H01R 4/18*   (2006.01)
*H01R 12/53*   (2011.01)

(52) U.S. Cl.
CPC ......... *H01R 13/6594* (2013.01); *H01R 4/185* (2013.01); *H01R 12/53* (2013.01); *H05K 1/0213* (2013.01); *H05K 1/11* (2013.01); *H05K 2201/10356* (2013.01)

(58) Field of Classification Search
CPC .... H01R 13/6594; H01R 12/53; H01R 4/185; H05K 1/0213; H05K 2201/10356
See application file for complete search history.

(56) References Cited

U.S. PATENT DOCUMENTS

| 8,052,466 | B2 * | 11/2011 | Okamoto | ............... H01R 4/184 439/585 |
| 8,932,078 | B1 * | 1/2015 | Martin | .................. H01R 24/50 439/574 |

(Continued)

FOREIGN PATENT DOCUMENTS

| CN | 203386920 U | 1/2014 |
| DE | 1615695 A1 | 8/1970 |

(Continued)

*Primary Examiner* — Ishwarbhai B Patel
(74) *Attorney, Agent, or Firm* — Blank Rome LLP

(57) ABSTRACT

The invention relates to a shield connection element for a printed circuit board, comprising a contact part with a central flat soldering section for soldering onto a printed circuit board, and two crimping sections adjacent thereto, of which at least one is designed for connection to a cable shield of a cable.

8 Claims, 2 Drawing Sheets

(56) References Cited

U.S. PATENT DOCUMENTS

| | | | |
|---|---|---|---|
| 2012/0061140 A1* | 3/2012 | Nonen | H01R 4/023 |
| | | | 174/84 C |
| 2012/0231677 A1* | 9/2012 | Kallee | H01R 12/585 |
| | | | 439/834 |
| 2014/0220822 A1* | 8/2014 | Keyser | H01R 13/6592 |
| | | | 439/607.46 |
| 2014/0259660 A1* | 9/2014 | Poma | H01R 9/0518 |
| | | | 29/862 |
| 2015/0118917 A1* | 4/2015 | Poma | H01R 4/184 |
| | | | 439/877 |
| 2016/0093991 A1 | 3/2016 | Kobayashi et al. | |

FOREIGN PATENT DOCUMENTS

| | | |
|---|---|---|
| DE | 69513509 T2 | 7/2000 |
| DE | 202013006781 U1 | 8/2013 |
| DE | 102014108001 A1 | 12/2015 |
| EP | 1860737 A2 | 11/2007 |
| WO | WO-2016174228 A1 | 11/2016 |

\* cited by examiner

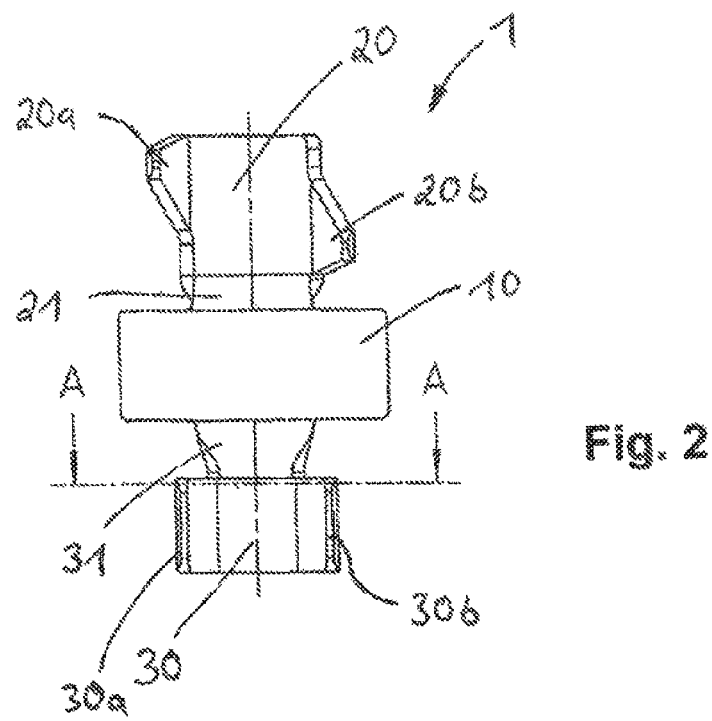
Fig. 2
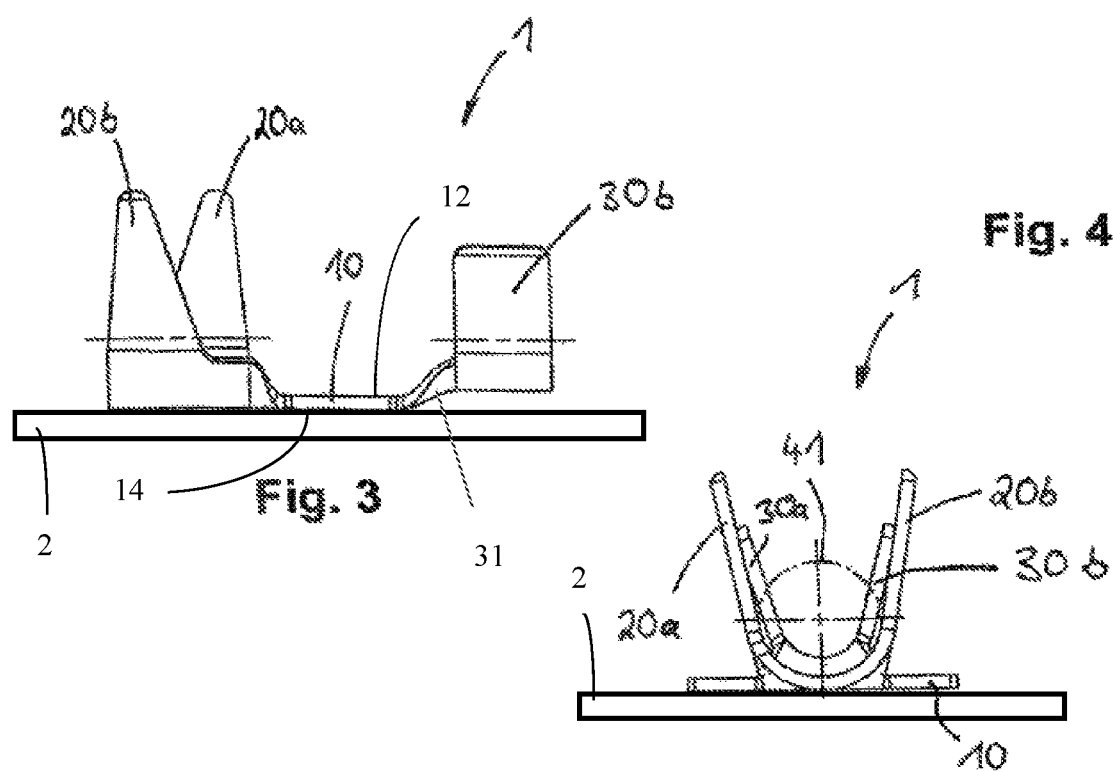
Fig. 3
Fig. 4

SHIELD CONNECTION ELEMENT FOR A PRINTED CIRCUIT BOARD

RELATED APPLICATIONS

This application is a national stage application of International Application No. PCT/EP2017/054247, filed Feb. 23, 2017, which claims priority to German Patent Application No. 20 2016 101 128.0, filed Mar. 2, 2016, the entire disclosures of which are hereby incorporated by reference.

FIELD OF THE INVENTION

The present invention relates to a shield connection element for a printed circuit board, in particular to a shield connection element for making direct contact with or soldering onto a printed circuit board.

BACKGROUND

Shield of electronic devices and appliances generally serve to keep electrical or magnetic fields away from said electronic devices and appliances or, conversely, to protect the surrounding area from the fields emanating from the device. That is to say, electromagnetic shielding can be required both in and also from an electrical device a cable and the like.

Since electromagnetic waves can have negative influences on other electrical appliances, both emitted magnetic and electrical radiation have to be reliably prevented or sufficiently shielded and reduced.

Electromagnetic compatibility (EMC) identifies the usually desired state of an appliance or an apparatus. This means that apparatuses of this kind are not influenced in an interfering manner by unintentional or improper electrical or electromagnetic effects. It is important for ensuring the electromagnetic compatibility of electrical operating means that they are correctly designed and configured. Proof and confirmation of corresponding interference sensitivity are regulated by the EMC guidelines and EMC standards.

In this respect, it is also generally required that shielded lines are used which, in turn, can be connected in as cost-effective and simple a manner as possible on the printed circuit boards of electrical appliances of this kind.

It is also necessary in this respect both to electrically connect the signal- or current-carrying conductors to the printed circuit board and also to make contact with the cable shield by way of corresponding shield apparatuses.

The solutions known in the prior art for connecting shielded lines directly to a printed circuit board have various disadvantages.

For example, there are solutions in which the cable has to be unraveled in such a way that the shield is to be fastened directly to a shield connection on the printed circuit board, while secondly an electrical connection to the signal-carrying conductors is to be established.

In this case, it is generally already difficult for reasons of space to initially perform the connection of the signal lines or current-carrying lines and subsequently the shield connection.

Other plug-in connector solutions which are already complete and comprise a housing, a shield contact-making system which is arranged in the housing, and also a contact carrier with contacts are of complex construction, expensive in respect of production and also complicated in respect of adapting to different applications and appliances.

The present invention overcomes the abovementioned disadvantages and provides a particularly universally usable and simple solution for making shielding contact between a printed circuit board and a shielded cable.

This object is achieved by a shield connection having the features of claim 1.

The basic idea of the present invention is to provide a shield connection element of the kind which has at least one flat soldering section which is arranged between a cable crimping and a shield crimping such that the current-carrying conductor can be routed beyond the contact part, while 360° shield connection of the cable shield to the cable to be connected is possible.

According to the invention, the central flat soldering section which is arranged therebetween can further already be directly soldered onto or electrically connected on the surface of a printed circuit board, for example on a contact-making pad of a printed circuit board, owing to its flat geometry.

Owing to the universal configuration of a shield connection element according to the invention of this kind, it is possible to make direct contact with an extremely wide variety of types of printed circuit boards and applications by way of a shield connection element according to the present invention.

Therefore, according to the invention, a shield connection element is provided for a printed circuit board, said shield connection element comprising a contact part with a central flat soldering section (soldering plate) for soldering onto a printed circuit board and two crimping sections which are adjacent to said soldering section, at least one of which crimping sections is designed for connection to a cable shield of a cable.

It is further advantageous when the soldering section is formed directly between the first crimping section and the second crimping section. In this way, a particularly installation-friendly connection to the printed circuit board can be formed and a corresponding sequence of cable crimping, soldering connection and shield connection can take place.

In a preferred embodiment of the invention, it is further provided that the first crimping section forms crimping tabs which each laterally protrude and extend in a direction Q transverse to the direction A of connection to the soldering section. The direction A of connection of the two crimping sections to the soldering section also constitutes the direction of longitudinal extent of the shield connection element.

It is further advantageously provided when the second crimping section forms crimping tabs which each laterally protrude and likewise extend in a direction transverse to the direction A of connection to the soldering section and therefore extend substantially in the same lateral direction as the first crimping tabs of the first crimping section.

According to the invention, it is further advantageously provided that each crimping section is connected to the soldering section by means of a transition section.

The width of the soldering section as viewed in the transverse direction Q is advantageously greater than the width of the respective transition sections.

In a further advantageous refinement of the invention, it is provided that the crimping tabs of the first crimping section are designed as V-shaped tabs which extend substantially diametrically away from the crimping section and further preferably are diagonally offset in relation to one another to a certain extent, so that, when folded around the cable to be attached, they come into contact with the cable substantially with their ends next to one another.

In a further advantageous embodiment of the invention, it is provided that the crimping tabs of the second crimping section are designed as U-shaped or rectangular tabs, wherein the length of the crimping tabs of the second crimping section is further preferably smaller than the length of the crimping tabs of the first crimping section as viewed in the transverse direction.

It is further preferred when the contact part is connected to a shielded line, and one of the crimping tabs fully encloses the shield of the cable over the entire circumference, preferably over an angle of 360°, so that 360° contact is achieved.

According to the invention, an encircling O-crimp and also a planar face for soldering an auxiliary contact are accordingly provided, said encircling O-crimp and planar surface being realized by the features mentioned above.

Damage to the dielectric and also penetration of the printed circuit board can be prevented by a 360° shield connection of the line in this way.

A further aspect of the present invention accordingly relates to a printed circuit board comprising a shield connection element as described above, wherein the shield connection element, by way of its soldering section, is mounted directly onto the printed circuit board in an electrical contact-making manner.

BRIEF DESCRIPTION OF THE DRAWINGS

Further advantages, objectives and details of the invention are revealed in the description of exemplary embodiments and also with reference to the drawings. In the drawings:

FIG. 2 shows a plan view of one of the shield connection elements according to the invention in accordance with FIG. 1, in which the crimping tabs are illustrated in a different installation position;

FIG. 3 shows a side view of the embodiment in accordance with FIG. 2;

FIG. 4 shows a front view of the image from FIG. 2.

DETAILED DESCRIPTION

Figure 1:
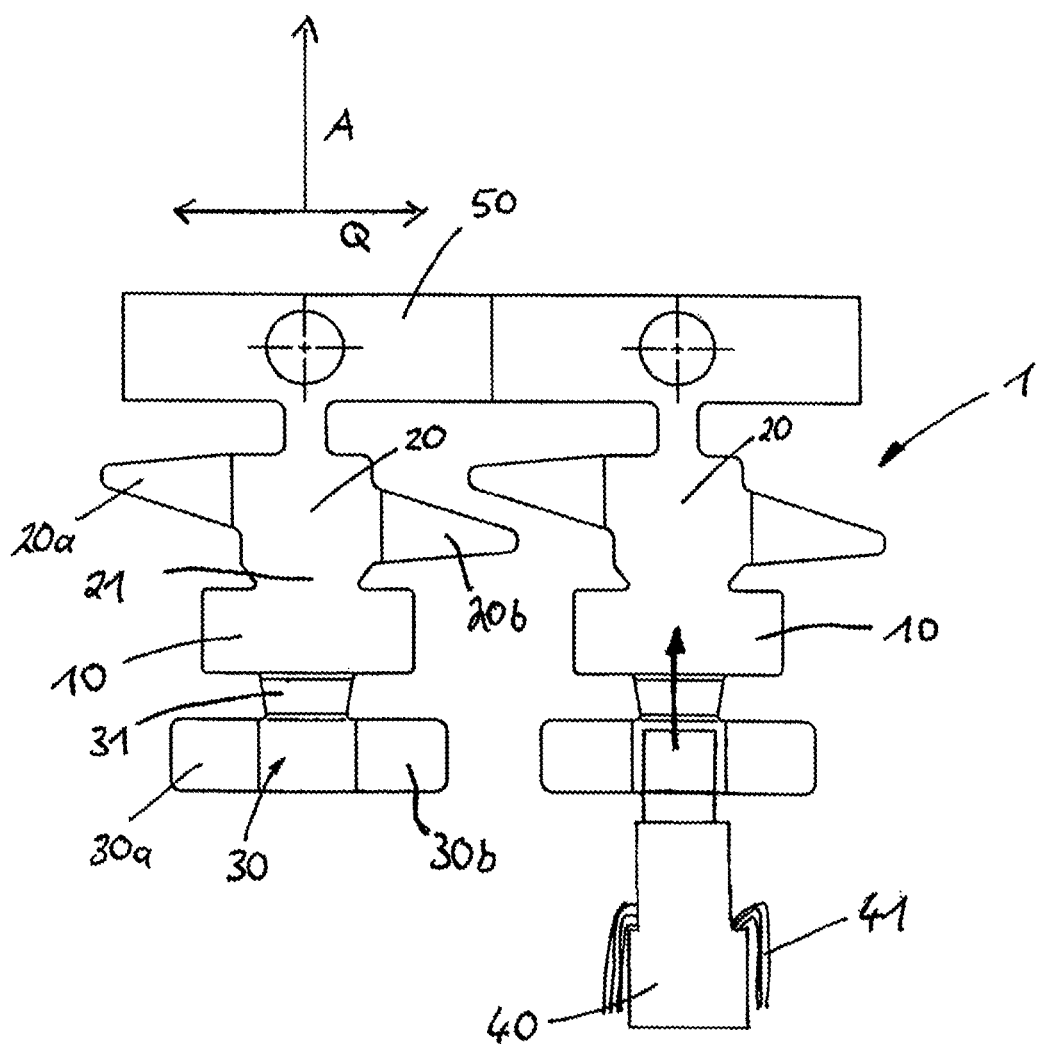
FIG. 1 shows a plan view of a pair of shield connection elements which are fitted to a conveyor belt.

The invention will be explained in more detail below with reference to FIGS. 1 to 4, wherein identical reference symbols refer to identical functional and/or structural features.

Each of FIGS. 1 to 4 illustrates a shield connection element 1 for a printed circuit board.

FIG. 1 illustrates a pair of shield connection elements 1 on a conveyor belt 50. Each shield connection element 1 has a central flat soldering section 10 for soldering onto a printed circuit board. Soldering section 10 has a top flat side 12 and a bottom flat side 14, as seen in FIGS. 3 and 4. The bottom side 14 of the soldering section 10 serves for direct soldering onto a printed circuit board 2 and is of planar and flat design, as is clearly shown in the side view in FIG. 3 and FIG. 4.

A first crimping section 20 and, situated opposite, a second section 30 are located adjacent to the central flat soldering section 10, wherein one of the crimping sections in the present example, preferably the crimping section 30 which is situated at the bottom in FIG. 1, is designed for connection to the cable shield 41 of a cable 40 which is illustrated by way of example in FIG. 1. Said figure shows a cable 40, in which the cable shield 41 is folded back, to which the shield connection element 1 according to the invention (shifted in the arrow direction) is to be connected.

As shown in the figures, the soldering section is situated directly between the crimping sections 20, 30.

FIGS. 1 to 4 further show that the first crimping section 20 forms respectively laterally protruding crimping tabs 20a, 20b which extend in direction Q transverse to the direction A of connection to the soldering sections 10.

It is further shown that the second crimping section 30 also forms in each case laterally protruding crimping tabs 30a, 30b which likewise extend in the direction Q transverse to the direction A of connection to the soldering section 10, specifically diametrically opposite the first crimping section 20.

As is likewise clearly shown in FIG. 1, each crimping section 20, 30 is directly integrally connected to the soldering section 10 by means of a transition section 21, 31. As seen in FIG. 3, the transition section 31 extends from the soldering section 10 at an angle away from the printed circuit board. The width of the soldering section 10 as viewed in transverse direction Q is greater than the width of the two transition sections 21, 31 in each case.

As is particularly clear in the side view of FIG. 3, the crimping tabs 20a, 20b of the first crimping section 20 are designed as V-shaped tabs and the crimping tabs 30a, 30b of the second crimping section 30 are designed as U-shaped or rectangular tabs.

It is also clear that the length of the crimping tabs 30a, 30b of the second crimping section 30 is smaller than the length of the crimping tabs 20a, 20b of the first crimping section 20 as viewed in the transverse direction Q or overall in the mounted position too.

Overall, it is provided that the length of the crimping tabs (20a, 20b, 30a, 30b) is in each case matched to the cable cross section and therefore to the circumference of the cable 40 in the shielding region.

As indicated by a circular line in FIG. 4, it is provided that the contact part is connected to a shielded line such that the crimping tabs 30a, 30b enclose the cable shield 41 of the cable 40 over the entire circumference through an angle of 360° and therefore 360° contact is made with the cable shield 41 of the cable 40.

An arrangement in which a large number of shield connection elements 1 according to the invention in accordance with one of FIGS. 1 to 3 are fastened to a conveyor belt 50, so that not only transportation of the shielding belt as such, but also processing, can be performed in an automated process is particularly efficient and advantageous.

The invention is not restricted to the exemplary embodiment described in the present case, but rather likewise comprises equivalent embodiments, even if not explicitly described.

Furthermore, the invention comprises arrangements which have the above-described central elements of the shield connection elements according to the invention. For example, it can be provided that a further crimping section is provided in addition to the abovementioned crimping sections.

LIST OF REFERENCE SYMBOLS

1 Shield connection element
10 Soldering section
20 First crimping section
20a, 20b Crimping tabs
21 Transition section
30 Second crimping section
30a, 30b Crimping tabs
31 Transition section 40 Cable
41 Cable shield
50 Conveyor belt
A Direction of connection
Q Transverse direction

The invention claimed is:

1. A printed circuit board comprising:
a shield connection element that comprises a contact part with a central flat soldering section for soldering onto the printed circuit board and two crimping sections which are adjacent to said central flat soldering section, at least one of which crimping sections is designed for connection to a cable shield of a cable, each of said crimping sections is connected to said central flat soldering section by a transition section,
wherein at least one of said transition sections extends from said central flat soldering section at an angle in a direction away from the printed circuit board, and
wherein the shield connection element, by way of said central flat soldering section, is mounted directly onto the printed circuit board in an electrically contact-making manner.

2. The printed circuit board as claimed in claim 1, wherein the central flat soldering section is formed between the first crimping section and the second crimping section.

3. The printed circuit board as claimed in claim 1, wherein the first crimping section forms crimping tabs which each laterally protrude and extend in a direction transverse to the direction of connection to the central flat soldering section.

4. The printed circuit board as claimed in claim 3, wherein the crimping tabs of the first crimping section are designed as V-shaped tabs.

5. The printed circuit board as claimed in claim 1, wherein the second crimping section forms crimping tabs which each laterally protrude and extend in a direction transverse to the direction of connection to the central flat soldering section.

6. The printed circuit board as claimed in claim 5, wherein the crimping tabs of the second crimping section are designed as U-shaped or rectangular tabs, wherein the length of the crimping tabs of the second crimping section is smaller than the length of the crimping tabs of the first crimping section as viewed in a transverse direction.

7. The printed circuit board as claimed in claim 1, wherein said central flat soldering section defines a width in a transverse direction and each of said transition sections defines a width in the transverse direction, and the width of the central flat soldering section is greater than the width of the respective transition sections.

8. The printed circuit board as claimed in claim 1, wherein the contact part is connected to a shielded line, and one of the crimping tabs encloses the cable shield of the cable over the entire circumference, over an angle of 360°, so that 360° contact is achieved.

* * * * *